(12) United States Patent
Yang et al.

(10) Patent No.: US 8,325,507 B2
(45) Date of Patent: Dec. 4, 2012

(54) MEMRISTORS WITH AN ELECTRODE METAL RESERVOIR FOR DOPANTS

(75) Inventors: Jianhua Yang, Palo Alto, CA (US); Wei Yi, Mountain View, CA (US); Michael Josef Stuke, Palo Alto, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 251 days.

(21) Appl. No.: 12/893,825

(22) Filed: Sep. 29, 2010

(65) Prior Publication Data

US 2012/0074372 A1 Mar. 29, 2012

(51) Int. Cl.
*H01L 29/8605* (2006.01)
*H01L 21/04* (2006.01)
*G11C 11/21* (2006.01)

(52) U.S. Cl. ............... 365/148; 257/1; 257/E21.363; 257/E25.014; 257/E29.326; 257/E27.047; 438/382; 438/385

(58) Field of Classification Search ............... 365/148; 257/1, E21.363, E25.014, E29.326, E27.047; 438/382, 385
See application file for complete search history.

(56) References Cited

U.S. PATENT DOCUMENTS

| | | | | |
|---|---|---|---|---|
| 7,498,600 B2 * | 3/2009 | Cho et al. | | 257/2 |
| 7,781,230 B2 * | 8/2010 | Odagawa et al. | | 438/3 |
| 7,863,087 B1 * | 1/2011 | Kumar et al. | | 438/104 |
| 7,985,962 B2 * | 7/2011 | Bratkovski et al. | | 257/4 |
| 8,227,896 B2 * | 7/2012 | Jiang et al. | | 257/536 |
| 2007/0269683 A1 * | 11/2007 | Chen et al. | | 428/697 |
| 2008/0090337 A1 | 4/2008 | Williams | | |
| 2010/0038791 A1 * | 2/2010 | Lee et al. | | 257/758 |
| 2012/0001146 A1 * | 1/2012 | Lu et al. | | 257/4 |
| 2012/0012809 A1 * | 1/2012 | Yang et al. | | 257/4 |
| 2012/0039109 A1 * | 2/2012 | Srinivasan et al. | | 365/148 |
| 2012/0063197 A1 * | 3/2012 | Yang et al. | | 365/148 |
| 2012/0113706 A1 * | 5/2012 | Williams et al. | | 365/148 |
| 2012/0205610 A1 * | 8/2012 | Phatak et al. | | 257/4 |

\* cited by examiner

*Primary Examiner* — Evan Pert
(74) *Attorney, Agent, or Firm* — David W. Collins (57) ABSTRACT

A memristor includes a first electrode of a nanoscale width; a second electrode of a nanoscale width; and an active region disposed between the first and second electrodes. The active region has a both a non-conducting portion and a source of dopants portion induced by electric field. The non-conducting portion comprises an electronically semiconducting or nominally insulating material and a weak ionic conductor switching material capable of carrying a species of dopants and transporting the dopants under an electric field. The non-conducting portion is in contact with the first electrode and the source of dopants portion is in contact with the second electrode. The second electrode comprises a metal reservoir for the dopants. A crossbar array comprising a plurality of the nanoscale switching devices is also provided. A process for making at least one nanoscale switching device is further provided.

20 Claims, 6 Drawing Sheets

ND AN ELECTRODE METAL RESERVOIR FOR DOPANTS

MEMRISTORS WITH AN ELECTRODE METAL RESERVOIR FOR DOPANTS

STATEMENT REGARDING FEDERALLY SPONSORED RESEARCH OR DEVELOPMENT

This invention has been made with government support. The government has certain rights in the invention.

BACKGROUND ART

The continuous trend in the development of electronic devices has been to minimize the sizes of the devices. While the current generation of commercial microelectronics are based on sub-micron design rules, significant research and development efforts are directed towards exploring devices on the nanoscale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interest, and there are substantial ongoing research efforts to further develop such nanoscale switches and to implement them in various applications. One of the many important potential applications is to use such a switching device as a memory unit to store digital data.

The devices recently reported using titanium oxide (and other oxides) typically have involved two oxide phases ($TiO_2$ and an oxygen-deficient phase, $TiO_{2-x}$). The two oxide phases (or one oxide phase, $TiO_2$, bounded by two oxygen-deficient phases, $TiO_{2-x}$) are contacted by metal electrodes, typically, Pt, Ru, W, or other suitable metals. Switching in these systems is achieved using oxygen vacancies. Other systems include the AlN system, in which switching is achieved using nitrogen ions. Broadly speaking, all these systems involve an insulator (oxide or nitride or other insulator material) sandwiched between two electrodes.

In such memristors, the switching material tends to lose its dopant material. The loss of dopant material adversely affects the endurance (life of cycling).

BRIEF DESCRIPTION OF THE DRAWINGS

FIGS. 5A and 5B are each a view similar to that of FIGS. 3 and 4, without regard to the details of the electrodes, schematically illustrating an operation example, in which FIG. 5A depicts the device in an OFF condition and FIG. 5B depicts the device in an ON condition.

BEST MODES FOR CARRYING OUT THE INVENTION

Reference is made now in detail to specific examples, which illustrates the best mode presently contemplated by the inventors for practicing the invention. Alternative examples are also briefly described as applicable.

It is noted that, as used in this specification and the appended claims, the singular forms "a," "an," and "the" include plural referents unless the context clearly dictates otherwise.

Figure 1A:
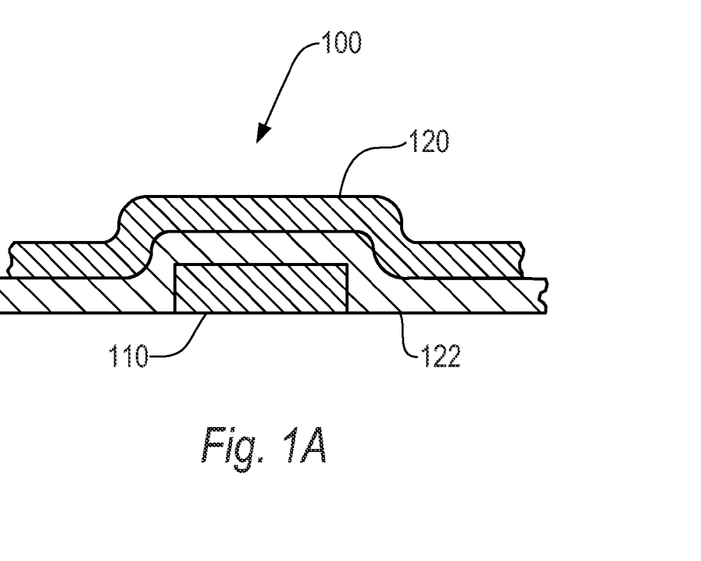
FIG. 1A is a cross-sectional view of a nanoscale switching device in accordance with an example of the invention.

FIG. 1A shows an example of a nanoscale switching device 100 in accordance with the invention. The switching device 100 includes a bottom, or first, electrode 110 and a top, or second, electrode 120, and an active region 122 disposed between the two electrodes. Each of the bottom and top electrodes 110 and 120 is formed of a conducting material and has a width and a thickness on the nanoscale. As used hereinafter, the term "nanoscale" means the object has one or more dimensions smaller than one micrometer. In this regard, each of the electrodes may be in the form of a nanowire. Generally, the active region 122 contains a switching material that is capable of carrying a selected species of dopants such that the dopants can drift through the switching material under a sufficiently strong electric field. The drifting of the dopants results in a redistribution of dopants in the active region, which is responsible for switching behavior of the device, as will be described in greater detail below.

Figure 1B:
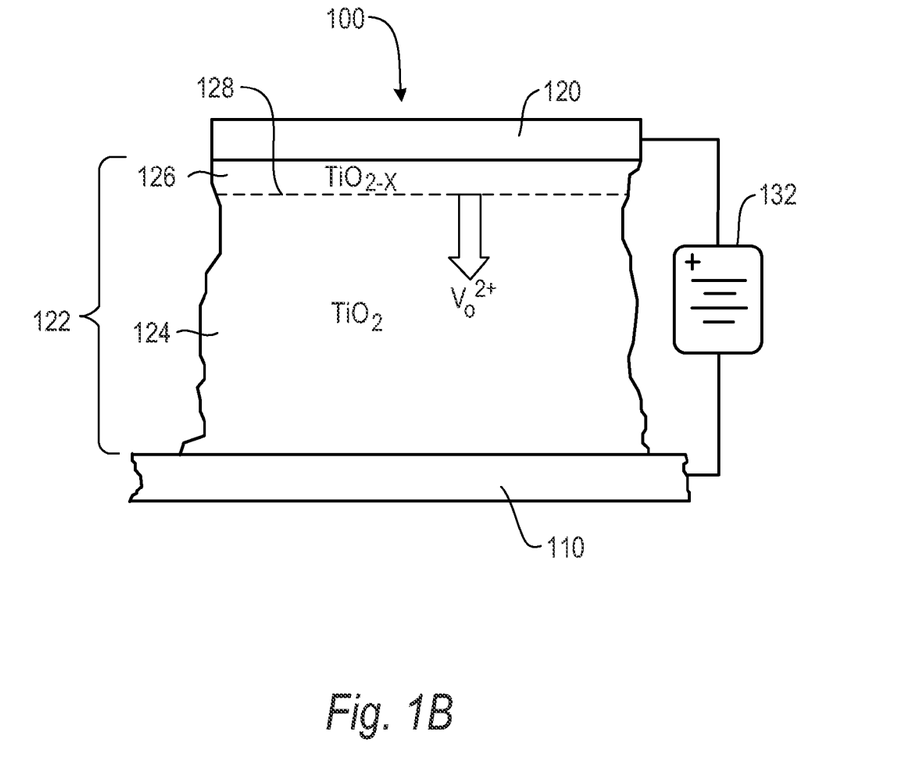
FIG. 1B is a schematic depiction of the nanoscale switching device of FIG. 1A showing its components.

To facilitate a better understanding of the significance of the issue addressed by the invention, the components and operation principles of the switching device 100 are described first, with reference to FIG. 1B. As shown in FIG. 1B, in one example, the active region 122 between the top electrode 120 and bottom electrode 110 has two sub-regions: a primary active region 124 and a dopant source region 126. The primary active region 124 contains a switching material. The switching material is capable of carrying a species of mobile ionic dopants such that the dopants can be controllably transported into and/or through the switching material to change the electrical properties of either the switching material or the interface of the switching material and an electrode, which in the illustrated embodiment is the top electrode 120. This ability to change the electrical properties as a function of dopant distribution allows the switching device 100 to be placed in different switching states by applying a switching voltage to the electrodes.

The dashed line 128 is used to indicate that this boundary is not built in the device during fabrication (as in prior memristors), but rather is formed by and also mobile under an electric field, as discussed in greater detail below.

The primary active region 124 may have a non-conducting portion comprising an electronically semiconducting or nominally insulating material and a weak ionic conductor switching material capable of carrying a species of dopants and transporting the dopants under an electric field. The primary active region 124 is in contact with the first electrode 110.

The secondary region 126 may have a source of dopants portion. The secondary region 126 is in contact with the second electrode 120.

The nanoscale switching device 100 can be switched between ON and OFF states by controlling the concentration and distribution of dopants in the primary active region 124. When a DC switching voltage from a voltage source 132 is applied across the top and bottom electrodes 120 and 110, an electric field is created across the active region 122. This electric field, if of sufficient strength and proper polarity, may drive the dopants from the dopant source region 126 into the primary active region 124, and cause the dopants to drift through the switching material in the primary active region 124 towards the top electrode 120, thereby turning the device into an ON state.

If the polarity of the electric field is reversed, the dopants may drift in an opposite direction across the primary active region 124 and away from the top electrode, thereby turning the device into an OFF state. In this way, the switching is reversible and may be repeated. Due to the relatively large electric field needed to cause dopant drifting, after the switching voltage is removed, the locations of the dopants remain stable in the switching material. In other words, the switching may be non-volatile.

The state of the switching device may be read by applying a read voltage to the top and bottom electrodes 120 and 110 to sense the resistance across these two electrodes. The read voltage is typically much lower than the threshold voltage required to cause drifting of the ionic dopants between the top and bottom electrodes, so that the read operation does not alter the ON/OFF state of the switching device.

Previous work describes memristors comprising a switch having the following characteristics (see, e.g., R. Stanley Williams, US Patent Publication 2008/0090337A1, Apr. 17, 2008, the content of which is incorporated herein in its entirety):

A primary active layer, or region, of the switch comprises a thin film of a material that is electronically semiconducting or nominally electronically insulating and also a weakly ionic conductor. The primary active material is capable of transporting and hosting ions that act as dopants to control the flow of electrons through the switch. The basic mode of operation is to apply an electrical field (the drift field, which may exceed some threshold for enabling the motion of the ions in the primary material) across the switch large enough to cause an ionic species to be transported into or out of the primary material via ionic transport. The ionic species are specifically chosen from those that act as electrical dopants for the primary material, and thereby change the electrical conductivity of the material from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). Furthermore, the primary material and the dopant species are chosen such that the drift of the ions into or out of the primary material is possible but not too facile, to ensure that the switch will remain in whatever state it is set for a reasonably long time, perhaps many years at room temperature. This is to make sure the switch is nonvolatile, that is, that it holds its state after the drift field has been removed. The switch is a two-terminal device—applying a high bias to the switch causes both electron current and ion current to flow, whereas at a low bias the flow of ion current is negligible, which allows the switch to hold its resistance state.

A secondary active layer, or region, comprises a thin film of a material that is a source of dopants for the primary material. These dopants may be impurity atoms such as hydrogen or some other cation species, such as alkali or transition metals, that act as an electron donor for the primary material, or they may be anion vacancies, which in the primary material are charged and therefore are also donors for the lattice. It is also possible to drive anionic species into the primary host material, which will become electron acceptors (or hole donors).

The primary active material may be a thin film (generally less than 50 nm thick), and is in many cases nanocrystalline, nanoporous or amorphous. The mobility of the dopant species in such nanostructured materials is much higher than in a bulk crystalline material, since diffusion can occur through grain boundaries, pores or through local structural imperfections in an amorphous material. Also, because the film is so thin, the amount of time required to drift enough dopants into or out of a local region of the film to substantially change its conductivity is relatively rapid (e.g., the time t required for a diffusive process varies as the square of the distance covered, so the time to diffuse one nanometer is one-millionth the time required to diffuse one micrometer).

The switching materials (primary active and secondary active materials) are contacted on either side by metal electrodes or wires, or on one side by a semiconductor and the other side by a metal. The contact of the metal to the switching material depletes the semiconductor of free charge carriers, so in fact the material has a net charge that depends on the identity of the dopants—positive in the case of donors and negative in the case of acceptors. The metal-semiconductor contact regions electrically resemble Schottky barriers. The traditional description of a metal-semiconductor Schottky barrier is modified by the fact that the materials are structured at the nanometer scale, and so the structural and electrical properties are not averaged over the large distances over which the theory of semiconductor-metal contacts has been developed.

Conduction of electrons through the primary active material is via quantum mechanical tunneling of the electrons. When the semi-conducting material is essentially intrinsic, the tunneling barrier is high and wide, and thus the conductivity through the switch is low (OFF state). When a significant number of dopant species have been injected into the semiconductor, the width and perhaps the height of the tunneling barrier are diminished by the potential of the charged species. This results in an increase of the conductivity of the switch (ON state).

The ability of the charged species to diffuse into and out of the primary material is substantially improved if one of the interfaces connecting the switch to the metallic or semiconducting electrodes is non-covalently bonded. Such an interface may be caused by a void in the material or it may be the result of an interface that contains a molecular material that does not form covalent bonds with the electrode, the primary switch material, or both. This non-covalently bonded interface lowers the activation energy of the atomic rearrangements that are required for drift of the ionic species in the primary material. This interface is essentially an extremely thin insulator, and adds very little to the total series resistance of the switch.

Many examples of suitable combinations are given in the foregoing reference, including oxides, sulfides, selenides, nitrides, phosphides, arsenides, chlorides, and bromides of the transition and rare earth metals, with the alkaline earth metals often being present in compounds. Further, there are the various alloys of like compounds with each other, which can have a wide range of composition if they are mutually soluble in each other. Then there are the mixed compounds, in which there are two, three or more different metal atoms combined with some number of the electronegative elements. The dopants may be anion vacancies or different valent elements doped into the host.

As mentioned above, the switching material tends to lose its dopant material. The loss of dopant material adversely affects the endurance (life of cycling).

In accordance with the teachings herein, electrode materials that have a high solubility for the dopant material are employed. Consequently, such electrodes can also serve as a dopant reservoir to accommodate dopants drifted under an electric field during OFF switching. Since no strong bond is formed between the electrode material and the dopant material, the dopant can readily drift out of the electrode material under an opposite electric field for ON switching.

By a "high solubility" of dopant is meant that the metal has a solubility of at least 1 atomic percent (at %) for the dopant at room temperature. This is in contrast for many metals, which have a solubility of less than 1 at %, often much less than 0.5 at % at room temperature, for the dopants employed in memristors. It will be appreciated that the active regions of memristors often experience much higher temperatures during operation, where the solubility is even higher. The metals that have a high solubility of at least 1 at % at room temperature may have a solubility of greater than 10 at % at an elevated temperature, such as 600° C. For example, Zr has a solubility for N of up to 21 at % at 600° C.

Figure 2:
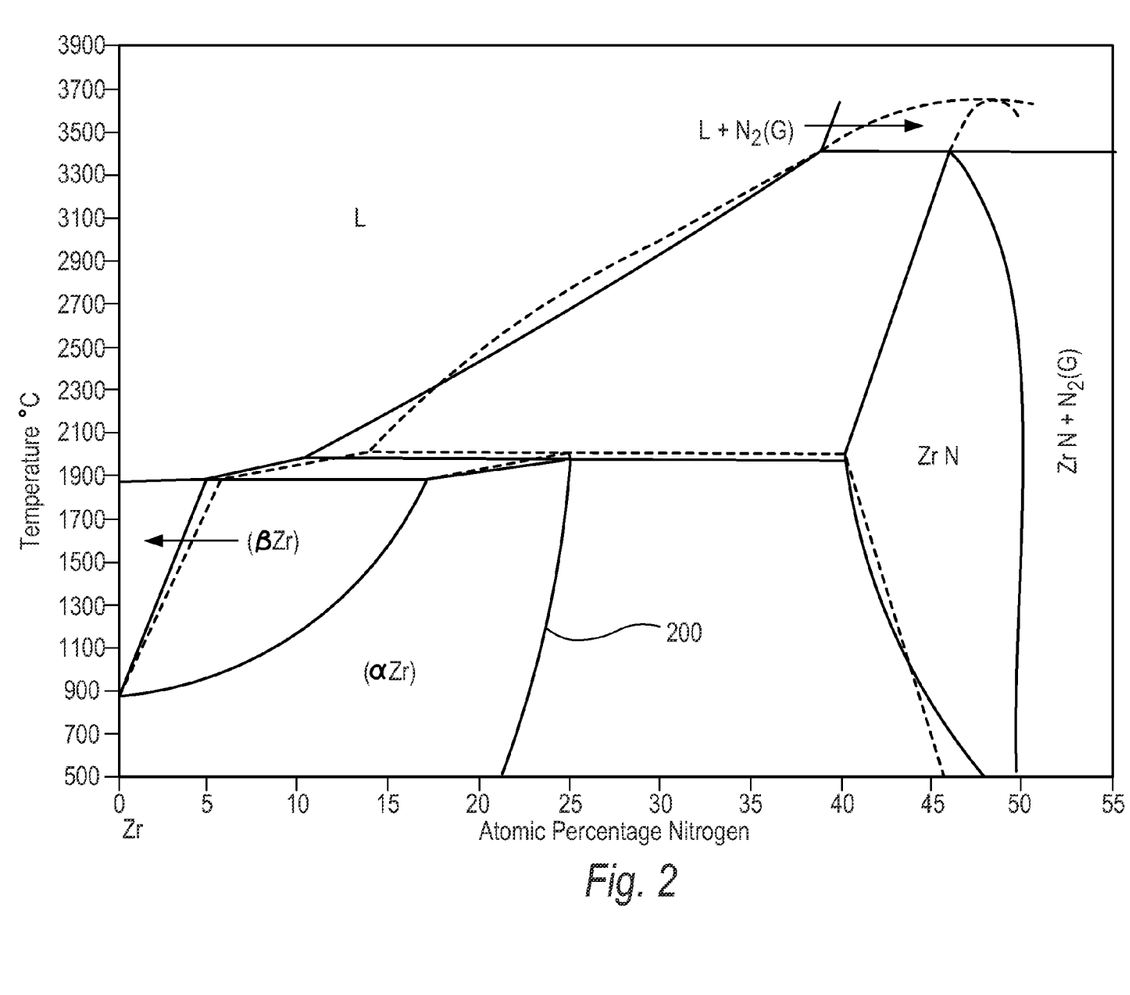
FIG. 2, on coordinates of temperature (in ° C.) and composition (in atomic percent), is a portion of the phase diagram for the Zr—N binary system, employed in an example.

FIG. 2 depicts the phase diagram for the Zr—N binary system. Phase boundary line 200 separates a phase consisting of αZr from a phase consisting of a mixture of αZr+Zr—N. The solubility of N in Zr is seen to be slightly more than 21 at % at 500° C. From an extrapolation of line 200 to room temperature, it may be inferred that the solubility of N in Zr is greater than 1 at % at room temperature.

Figure 3:
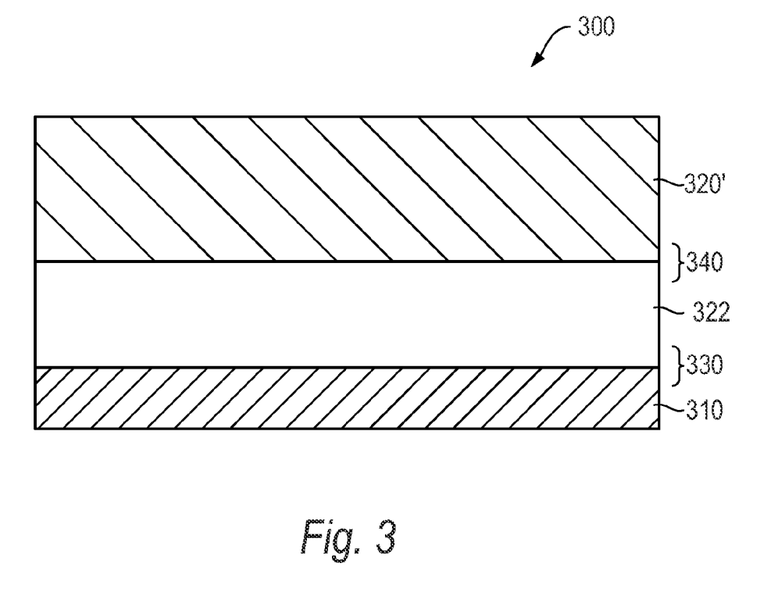
FIG. 3 is a cross-sectional view of the device depicted in FIG. 1, directed to the combination of the top and bottom electrodes and the switching material sandwiched between them, illustrating one example of the invention.

FIG. 3 depicts an example structure according to the teachings herein. Device 300 includes a bottom, or first, electrode, 310 and a top, or second, electrode 320'. A switching material is sandwiched between the two electrodes to form the active region 322.

The bottom electrode 310 may be a conventional electrode material, such as platinum (Pt), tungsten (W), ruthenium (Ru), titanium nitride (TiN), tantalum nitride (TaN), tungsten nitride (WN), ruthenium oxide ($RuO_2$), copper (Cu), aluminum (Al), palladium (Pd), gold (Au), silver (Ag), molybdenum (Mo), tantalum (Ta), or niobium (Nb).

The material comprising the switching layer 322 may be an oxide, nitride, or carbide, such as described above. In some examples, the switching material of the active region 322 may be $TiO_2$ or AlN. More specifically, for $TiO_2$, there are actually two regions present induced by electric field, where one region may comprise $TiO_2$ and the other region may comprise an oxygen-deficient region, $TiO_{2-x}$, where x is less than about 0.2. In some examples, the value of x may range from about 0.01 to 0.1 In some examples, the oxygen-deficient region may comprise a Magneli phase, specifically, $Ti_4O_7$.

The $TiO_2$ region, also referred to above as the primary active region, may be electronically semiconducting or nominally electronically insulating and also a weakly ionic conductor. The oxygen-deficient region, also referred to above as the secondary active region, may be a source (and sink) for dopants, in this case, oxygen vacancies. The $TiO_2$ region may be formed adjacent the bottom electrode 310, and forms a Schottky junction, also called a switching interface, 330 with the bottom electrode 310. The $TiO_{2-x}$ region may be formed adjacent the top electrode 320', and forms an ohmic contact, or ohmic interface, 340 with the top electrode.

In the case where AlN may be the switching material, again, there are two regions present, the primary active region, formed adjacent the bottom electrode 310 and comprising AlN and the secondary active region, formed adjacent the top electrode 320' and comprising $AlN_{1-x}$, where x is less than 0.2. In some examples, the value of x may range from 0.01 to 0.1. In this case, the dopants may comprise nitrogen vacancies.

From the foregoing discussion, the active region 322 includes at least one metallic element combined with a non-metallic element (e.g., $TiO_2$, AlN, and mixed metal oxide systems, to name a few examples). The metal comprising the first electrode 310 is different than the metallic element in the active region 322.

The top electrode 320' may be a metal that has a high solubility for the dopant species, oxygen vacancies in the case of the $TiO_2$—$TiO_{2-x}$ system or nitrogen vacancies in the case of the AlN—$AlN_{1-x}$ system. Examples of such metals include zirconium (Zr), hafnium (Hf), Ti, scandium (Sc), yttrium (Y), Nb, Ta, manganese (Mn), cobalt (Co), erbium (Er), and samarium (Sm), all of which exhibit a high solubility for the dopants O and N employed in the $TiO_2$—$TiO_{2-x}$ and AlN—$AlN_{1-x}$ systems, respectively. Other oxides, nitrides, sufides, selenides, carbides, phosphides can also be used as the switching materials with the above mentioned metals as one electrode.

The solubility for a given system (metal-dopant) may be inferred by an inspection of the phase diagram for that system. See FIG. 2 and the discussion above for an example of how the solubility may be inferred.

As indicated above, the oxygen-deficient region is induced by the electric field. The top electrode 320 itself may serve as the source (and sink) for dopants.

Figure 4:
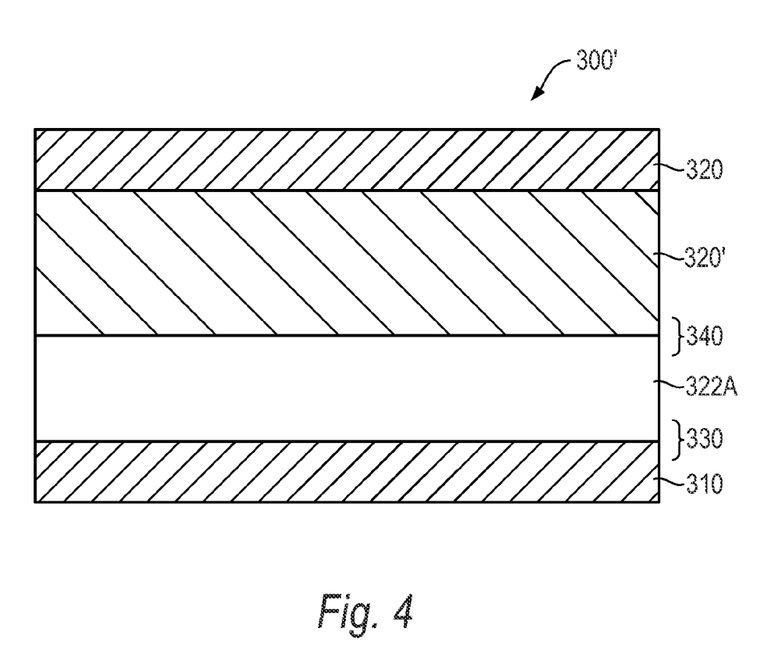
FIG. 4 is a view similar to that of FIG. 3, but illustrating another example of the invention.

FIG. 4 depicts another example structure according to the teachings herein. Device 300' includes a bottom, or first, electrode, 310 and a top, or second, electrode 320'. A switching material is sandwiched between the two electrodes to form the active region 322. In this example, the top electrode may comprise two layers, in which the first layer 320' may have relatively high solubility for the dopants and a second layer 320 may be a conventional electrode material, such as those listed above for the bottom electrode 310, namely, Pt, W, Ru, TiN, TaN, WN, $RuO_2$, Cu, Al, Pd, Ta, Au, Ag, Mo, or Nb. In all other respects, the bottom electrode 310, active region 322, and interfaces 330, 340 are as described with respect to FIG. 3.

Figure 5A:
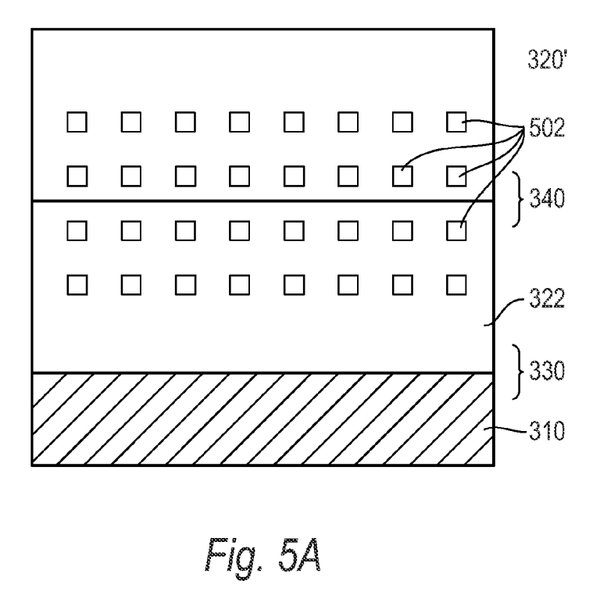
Figure 5B:
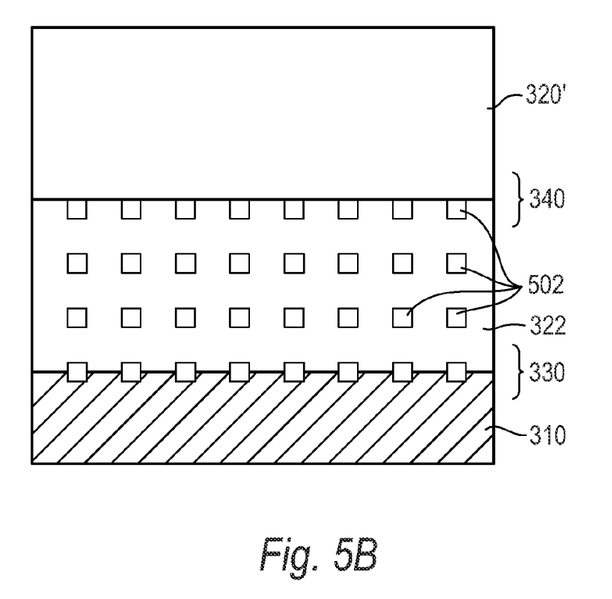

An operational example is depicted in FIGS. 5A-5B. In FIG. 5A, the device 300, 300' is in the OFF state. The dopants 502 are clustered about the ohmic interface 340. While in prior memristors, the upper part of the active region 320 may form the source of the dopants 502, here, the second electrode 320' itself may form the source of the dopants.

In the OFF state, there are essentially no dopants near the switching interface 330, and as a result, the resistance at that interface is relatively high, and no current flows through the device.

In FIG. 5B, the device 300, 300' is turned ON. This is done by impressing an electric field (not shown) between the two electrodes 310, 320, as described above with reference to FIG. 1B. The presence of the electric field causes the dopants to drift across the active region 322, until they reach the switching interface 330. The presence of the dopants around the switching interface 330 causes the resistance to drop, for example, by a factor of $10^4$ from the OFF state. In the ON state, current now flows through the device 300, 300'.

It will be appreciated that the presence of dopants 502 in the top electrode 320' ensures that there is an essentially continuous field of dopants across the entire active region 322. The top electrode 320' with large solubility of dopants may serve as the reservoir of dopants so that it can store the dopants without losing them in the OFF state. This ensures robustness of the memristor device 300, 300' and provides longer device life.

Figure 6:
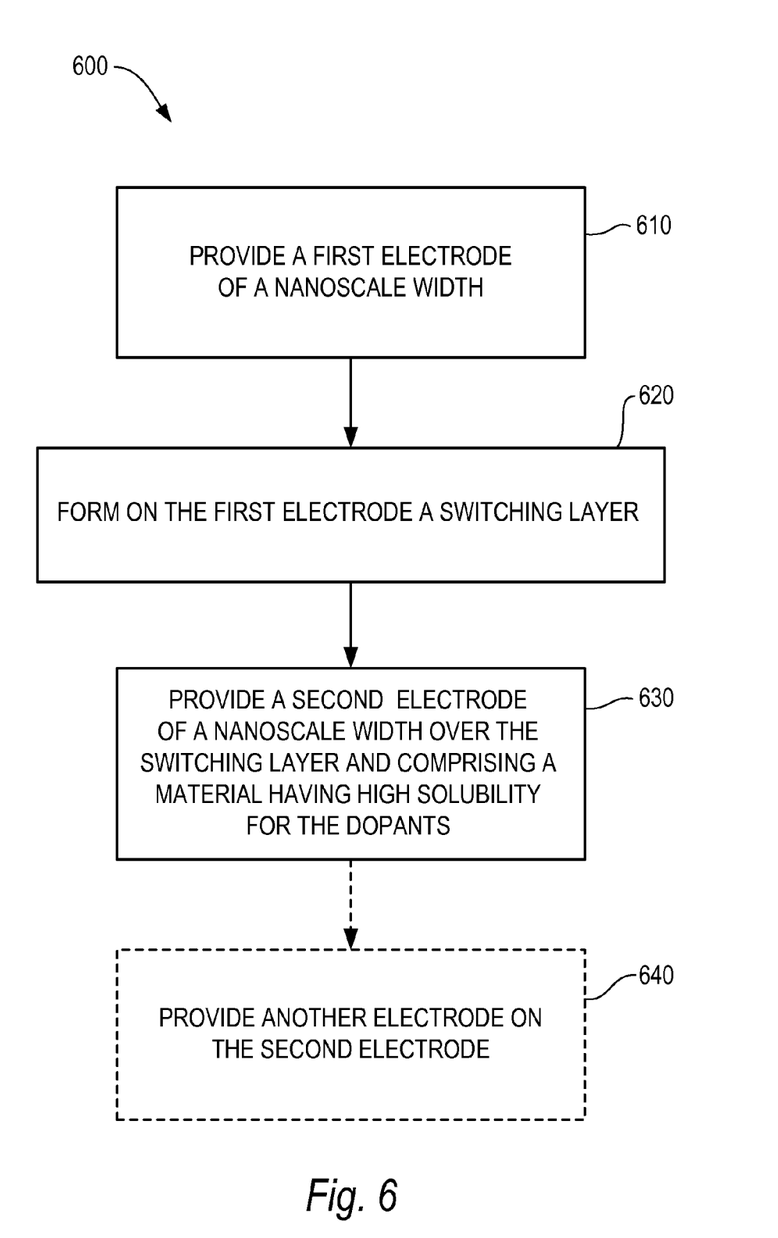
FIG. 6 is a process flow chart for fabricating a memristor in accordance with examples disclosed herein.

FIG. 6 is a flow chart of an exemplary process 600 used to form the device 300. First, the bottom electrode 310 may be formed 610. The switching layer 322, such as $TiO_2$ or AlN or other electronically semiconducting or nominally insulating and a weak ionic conductor, may then be formed 620 on the bottom electrode 310. The deposition condition for the switching layer can be controlled to determine the initial dopant volume. For example, for native dopants, such as N vacancies, the ratio of $N_2$ and Ar in the working gas during sputtering determines the amount of N vacancies inside the switching materials. For non-native dopants, such as Al inside $TiO_2$, the amount of Al can be controlled by ion implantation, for example. Finally, the top electrode 320' may be formed 630 on the switching layer 322. To complete the device 300', another electrode 320 may be formed 640 on the top electrode 320'.

Memristor switch devices, which are often formed of nanoscale metal layer/switching layer/metal layer, may employ an "electroforming" process to enable resistive switching. Electroforming may be another approach to create dopants inside the switching materials. The "electroforming" process may involve a one-time application of a relatively high voltage or current that produces a significant permanent change of electronic conductivity through the titanium oxide layer. The electrical switching arises from the coupled motion of electrons and ions within the active region. During the electroforming process for the $TiO_2$—$TiO_{2-1}$ system, for example, oxygen vacancies are created and drift towards the cathode, forming localized conducting channels of sub-oxides in the oxide. In the case of the AlN—$AlN_{1-x}$ system, it is nitrogen vacancies that are created.

The electrodes 310, 320 may comprise any of the common electrode materials, such as Pt, Ru, W, TiN, TaN, WN, $RuO_2$, Cu, Al, Pd, Ta, Au, Ag, Mo, Nb, etc., and may be the same or different. The thickness of the electrodes 310, 320 is that commonly employed in the construction of memristors, typically on the order of 10 to 100 nm or thicker. The thickness of the active region 322 is in the range of 0.5 to 50 nm.

Figure 7:
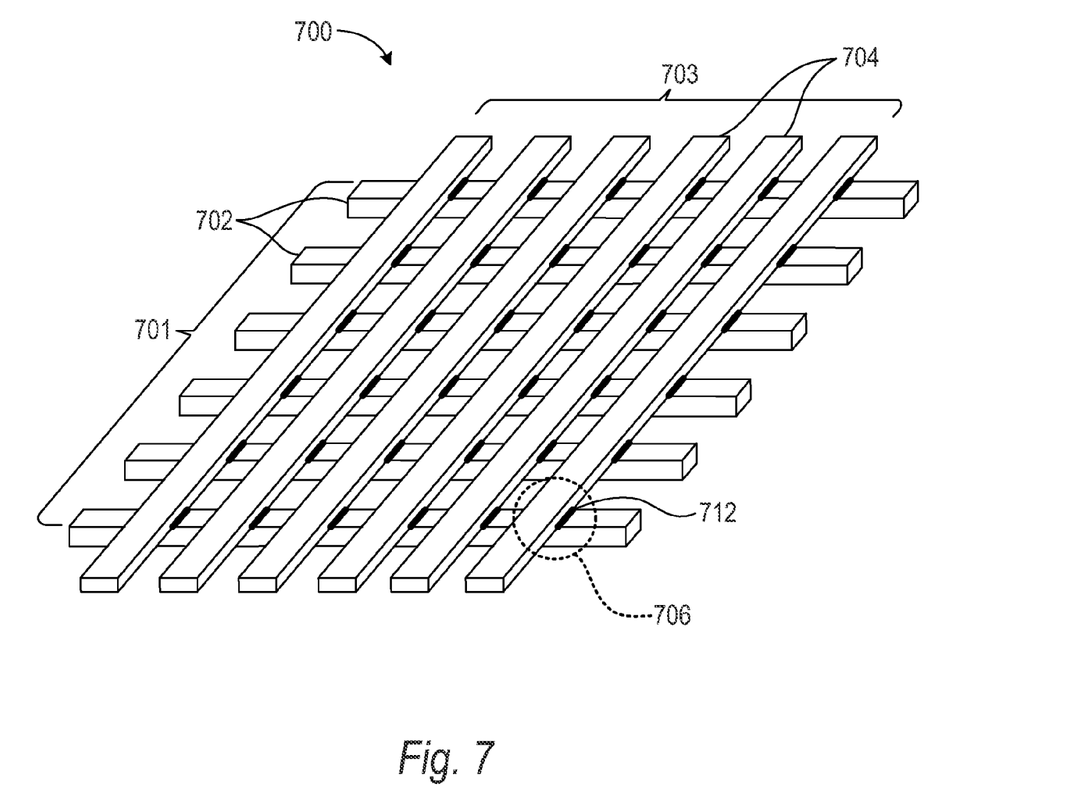
FIG. 7 is a schematic cross-sectional view of a crossbar array of nanoscale switching devices in accordance with an example of the invention.

The nanoscale switching device 300, 300' with electrodes 320 having a high solubility for the dopant material may be formed into an array for various applications. FIG. 7 shows an example of a two-dimensional array 700 of such switching devices. The array 700 has a first group 701 of generally parallel nanowires 702 running in a first direction, and a second group 703 of generally parallel nanowires 704 running in a second direction at an angle, such as 90 degrees, from the first direction. The two layers of nanowires 702 and 704 form a two-dimensional lattice which is commonly referred to as a crossbar structure, with each nanowire 702 in the first layer intersecting a plurality of the nanowires 704 of the second layer. A two-terminal switching device 706 may be formed at each intersection of the nanowires 702 and 704. The switching device 706 has a nanowire of the second group 703 as its top electrode and a nanowire of the first group 701 as the bottom electrode, and an active region 712 containing a switching material between the two nanowires. In accordance with an example of the invention, one of the two electrodes contacting the active region 712 has an electrode comprising a material that has a high solubility of dopant material, and may have a structure according to an example, such as described above with reference to FIG. 3. Alternatively, each device may have a first top electrode comprising the comprising the material having the high solubility of dopant material (not shown), with a second top electrode formed thereon, such as described above with reference to FIG. 4.

Although the first electrode 310 and the second electrode 320' have been depicted as having rectangular cross-sections in the various Figures, it should be understood that the first electrode 310 and/or the second electrode 320', as well as additional second electrode 320, may have other cross-sectional shapes, such as, circular, oval, hexagonal, triangular, trapezoidal, etc.

In the foregoing description, numerous details are set forth to provide an understanding of the present invention. However, it will be understood by those skilled in the art that the present invention may be practiced without these details. While the invention has been disclosed with respect to a limited number of examples, those skilled in the art will appreciate numerous modifications and variations therefrom. It is intended that the appended claims cover such modifications and variations as fall within the true spirit and scope of the invention.

What is claimed is:

1. A memristor, including:
   a first electrode of a nanoscale width;
   a second electrode of a nanoscale width; and
   an active region disposed between the first and second electrodes, the active region having both a non-conducting portion comprising an electronically semiconducting or nominally insulating material and a weak ionic conductor switching material capable of carrying a species of dopants and transporting the dopants under an electric field and a source of dopants portion induced by an electric field, the non-conducting portion in contact with the first electrode and the source of dopants portion in contact with the second electrode;
   wherein the second electrode comprises a metal reservoir for the dopants.

2. The memristor of claim 1 wherein the active region includes a metallic element combined with a non-metallic element and wherein the metal comprising the first electrode is different than the metallic element.

3. The memristor of claim 1 wherein the second electrode comprises a metal having a solubility for the dopants of at least 1 at % at room temperature.

4. The memristor of claim 1 wherein the non-conducting portion comprising $TiO_2$, the weak ionic conductor switching material comprising $TiO_{2-x}$, where x is less than about 0.2, the dopant comprises oxygen vacancies, and the second electrode comprises a metal selected from the group consisting of Zr, Hf, Ti, Sc, Y, Nb, Ta, Mn, Co, Er, and Sm.

5. The memristor of claim 1 wherein the non-conducting portion comprising AlN, the weak ionic conductor switching material comprising $AlN_{1-x}$, where x is less than about 0.2, the dopant comprises nitrogen vacancies, the second electrode comprises a metal selected from the group consisting of Zr, Hf, Ti, Sc, Y, Nb, Ta, Mn, Co, Er, and Sm.

6. The memristor of claim 1 wherein the first electrode comprises a material selected from the group consisting of Pt, Ru, W, TiN, TaN, WN, $RuO_2$, Cu, Al, Pd, Au, Ag, Mo, Ta, and Nb.

7. The memristor of claim 5 wherein the second electrode includes an additional electrode on top thereof.

8. The memristor of claim 6 wherein the additional electrode comprises a material selected from the group consisting of Pt, Ru, W, TiN, TaN, WN, $RuO_2$, Cu, Al, Pd, Au, Ag, Mo, Ta, and Nb that may be the same or different as the material comprising the first electrode.

9. A nanoscale crossbar array comprising:
a first group of conducting nanowires running in a first direction;
a second group of conducting nanowires running in a second direction and intersecting the first group of nanowires;
a plurality of switching devices formed at intersections of the first and second groups of nanowires, each switching device having a first electrode formed by a first nanowire of the first group and a second electrode formed by a second nanowire of the second group, and an active region disposed at the intersection between the first and second nanowires, the active region disposed between the first and second electrodes, the active region having both a non-conducting portion comprising an electronically semiconducting or nominally insulating material and a weak ionic conductor switching material capable of carrying a species of dopants and transporting the dopants under an electric field and a source of dopants portion induced by an electric field, the non-conducting portion in contact with the first electrode and the source of dopants portion in contact with the second electrode;
wherein the second group of conducting nanowires comprises a metal reservoir for the dopants.

10. The nanoscale crossbar array of claim 9 wherein the second electrode comprises a metal having a solubility for the dopants of at least 1 at % at room temperature.

11. The nanoscale crossbar array of claim 9 wherein the non-conducting portion comprising $TiO_2$, the weak ionic conductor switching material comprising $TiO_{2-x}$, where x is less than about 0.2, the dopant comprises oxygen vacancies, and the second electrode comprises a metal selected from the group consisting of Zr, Hf, Ti, Sc, Y, Nb, Ta, Mn, Co, Er, and Sm.

12. The nanoscale crossbar array of claim 9 wherein the non-conducting portion comprising AlN, the weak ionic conductor switching material comprising $AlN_{1-x}$, where x is less than about 0.2, the dopant comprises nitrogen vacancies, and the second electrode comprises a metal selected from the group consisting of Zr, Hf, Ti, Sc, Y, Nb, Ta, Mn, Co, Er, and Sm.

13. The nanoscale crossbar array of claim 9 wherein the first electrode comprises a material selected from the group consisting of Pt, Ru, W, TiN, TaN, WN, $RuO_2$, Cu, Al, Pd, Au, Ag, Mo, Ta, and Nb.

14. The nanoscale crossbar array of claim 13 wherein the second group of conducting nanowires includes an additional electrode on top thereof.

15. The nanoscale crossbar array of claim 14 wherein the additional electrode comprises a material selected from the group consisting of Pt, Ru, W, TiN, TaN, WN, $RuO_2$, Cu, Al, Pd, Au, Ag, Mo, Ta, and Nb that may be the same or different as the material comprising the first electrode.

16. A process for making at least one memristor, comprising:
providing a first electrode;
forming on the first electrode an active region disposed over the first electrode, the active region having both a non-conducting portion comprising an electronically semiconducting or nominally insulating material and a weak ionic conductor switching material capable of carrying a species of dopants and transporting the dopants under an electric field and a source of dopants portion induced by an electric field, the non-conducting portion in contact with the first electrode and the source of dopants portion in contact with the second electrode; and
providing a second electrode over the active region,
wherein the second electrode comprises a metal reservoir for the dopants, wherein the metal has a solubility for the dopants of at least 1 at % at room temperature.

17. The process of claim 16 further comprising providing an additional electrode over the second electrode, wherein the additional electrode comprises the same or different material as the first electrode.

18. The process of claim 17 wherein the first electrode and the additional electrode each comprise a material independently selected from the group consisting of Pt, Ru, W, TiN, TaN, WN, $RuO_2$, Cu, Al, Pd, Au, Ag, Mo, Ta, and Nb.

19. The process of claim 16 wherein the non-conducting portion comprising $TiO_2$, the weak ionic conductor switching material comprising $TiO_{2-x}$, where x is less than about 0.2, the dopant comprises oxygen vacancies, and the second electrode comprises a metal selected from the group consisting of Zr, Hf, Ti, Sc, Y, Nb, Ta, Mn, Co, Er, and Sm.

20. The process of claim 16 wherein the non-conducting portion comprising AlN, the weak ionic conductor switching material comprising $AlN_{1-x}$, where x is less than about 0.2, the dopant comprises nitrogen vacancies, and the second electrode comprises a metal selected from the group consisting of Zr, Hf, Ti, Sc, Y, Nb, Ta, Mn, Co, Er, and Sm.

* * * * *